(12) United States Patent
Tsutae

(10) Patent No.: US 7,816,272 B2
(45) Date of Patent: Oct. 19, 2010

(54) PROCESS OF CLEANING A SEMICONDUCTOR MANUFACTURING SYSTEM AND METHOD OF MANUFACTURING A SEMICONDUCTOR DEVICE

(75) Inventor: Hiroomi Tsutae, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 39 days.

(21) Appl. No.: 12/385,135

(22) Filed: Mar. 31, 2009

(65) Prior Publication Data

US 2009/0188526 A1 Jul. 30, 2009

Related U.S. Application Data

(62) Division of application No. 10/657,207, filed on Sep. 9, 2003, now abandoned.

(30) Foreign Application Priority Data

Jan. 16, 2003 (JP) ............................ 2003-008305

(51) Int. Cl.
*H01L 21/302* (2006.01)
(52) U.S. Cl. ................. 438/714; 438/710; 438/711; 438/712; 438/716; 438/787; 438/788; 438/791; 438/792; 438/905; 438/906
(58) Field of Classification Search ......... 438/710–712, 438/714, 716, 787–788, 791–792, 905–906
See application file for complete search history.

(56) References Cited

U.S. PATENT DOCUMENTS

| 5,900,161 | A | 5/1999 | Doi |
| 5,911,833 | A | 6/1999 | Denison et al. |
| 6,261,977 | B1 | 7/2001 | Tsai et al. |
| 6,322,716 | B1 | 11/2001 | Qiao et al. |
| 6,534,423 | B1 | 3/2003 | Turner |
| 6,852,243 | B2 | 2/2005 | Jurgensen et al. |
| 2003/0119328 | A1 | 6/2003 | Fujisato |
| 2004/0221869 | A1 | 11/2004 | Smith et al. |

FOREIGN PATENT DOCUMENTS

| JP | 07-201738 | 8/1995 |
| JP | 09-249976 | 9/1997 |
| JP | 10-147877 | 6/1998 |

*Primary Examiner*—Kevin M Picardat
*Assistant Examiner*—Bac H Au
(74) *Attorney, Agent, or Firm*—Rabin & Berdo, PC

(57) ABSTRACT

A process of cleaning a semiconductor manufacturing system, and a method of manufacturing a semiconductor device. The cleaning process includes, for example, positioning a ceramic cover on the electrostatic chuck in tight contact with the chuck, and feeding a fluoride-based cleaning gas into a chamber. After the cleaning process, a process of forming a semiconductor film (deposition process) is performed. It is possible to prevent fluorine degasification from a substrate-supporting electrode (electrostatic chuck) during the deposition process. A semiconductor film can be formed without causing a temperature drop near the substrate. This prevents irregular film thickness, defective etching, film flaking, etc.

4 Claims, 2 Drawing Sheets

PROCESS OF CLEANING A SEMICONDUCTOR MANUFACTURING SYSTEM AND METHOD OF MANUFACTURING A SEMICONDUCTOR DEVICE

This is a Divisional of U.S. application Ser. No. 10/657,207, filed Sep. 9, 2003, now abandoned the subject matter of which is incorporated herein by reference.

BACKGROUND OF THE INVENTION

1. Field of the Invention

The present invention generally relates to a process of cleaning a semiconductor manufacturing system such as a plasma-enhanced chemical vapor deposition (or plasma CVD) system. More specifically, the present invention relates to a process of cleaning a manufacturing system adapted to form a fluorine-containing silicon oxide film (referred to as "FSG film") such as an interlayer dielectric film of a semiconductor device. The present invention also relates to a method of manufacturing a semiconductor device. FSG stands for Fluorinated Silicate Glass.

2. Description of the Related Art

In general, a method of manufacturing a semiconductor device includes a plasma CVD process to form a semiconductor film on a substrate. Such film-formation process includes the steps of: placing a substrate on an electrostatic chuck provided in a reaction chamber; supplying a reactive gas into the reaction chamber; and applying high-frequency electric power between a pair of electrodes to generate a plasma and decompose the reactive gas molecules with the plasma, so that a semiconductor film is formed on the top surface of the substrate.

The film-formation process (deposition process) is repeated to manufacture a number of semiconductor devices. As the film-formation process is repeated, semiconductor films also accumulate on an inner wall of the reaction chamber and surfaces of the electrodes in the plasma enhanced CVD system. The semiconductor films deposited on the reaction chamber wall and electrodes may exfoliate and adhere to the substrate during the film-formation process. These semiconductor films contaminate the substrate.

Recently, therefore, a cleaning process is carried out to clean the inside of the reaction chamber of a plasma enhanced CVD system. The cleaning process uses a fluoride-based cleaning gas. In the cleaning process, a plasma is applied to the cleaning gas to generate fluorine atoms so as to clean (remove) films deposited on the inner wall of the reaction chamber and the surfaces of the electrodes. This cleaning process entails a problem that the fluorine atoms generated in the cleaning process are adsorbed on the inner wall of the reaction chamber and the surfaces of the electrodes, and remain there. Therefore, a fluorine-reducing gas is supplied into the reaction chamber to reduce and remove the residual fluorine atoms in the reaction chamber.

A specific example of a cleaning process is disclosed in Japanese Patent Kokai (Laid-Open Publication) No. 7-201738. In this cleaning process, active species (e.g., radicals or ions of nitride compounds) and a fluorine-reducing gas are supplied into the reaction chamber to cause the active species to act on the residual fluorine components, thereby reducing and removing the residual fluorine components.

Another cleaning process is disclosed in Japanese Patent Kokai No. 9-249976. This cleaning process uses $NF_3$, $CF_4$, $C_3F_8$, $C_2F_6$, or $ClF_3$ as a fluoride-based cleaning gas, and uses at least one kind of gas selected from the group consisting of $O_2$, $H_2$ and an inert gas as a fluorine-reducing cleaning gas.

Japanese Patent Kokai No. 10-147877 discloses another cleaning process in which an inert gas (or a mixture of the inert gas and nitrogen gas) is supplied into the reaction chamber as a fluorine-reducing gas to reduce and remove residual fluorine components after or during the cleaning by use of a fluorine-based cleaning gas.

In the cleaning processes disclosed above, a ceramic cover having the same shape as that of a substrate or wafer is usually positioned on an electrostatic chuck provided inside the reaction chamber of a plasma enhanced CVD system in order to protect the surface of the electrostatic chuck. Silicon oxide films inside the reaction chamber are removed by supplying a fluoride-based cleaning gas into the reaction chamber and generating a plasma. After the cleaning, a fluorine-reducing gas is supplied into the reaction chamber to generate the plasma, with the ceramic cover being left on the electrostatic chuck, thereby reducing and removing residual fluorine atoms in the reaction chamber.

During the cleaning of the plasma enhanced CVD system, the ceramic cover is placed on the electrostatic chuck to protect the surface of the electrostatic chuck.

However, there is a problem in the conventional cleaning process. Warp of the ceramic cover, etc. produce a clearance between the ceramic cover and the electrostatic chuck and thus a fluoride-based cleaning gas enters the clearance to cause fluorine components to be adsorbed on the surface of the electrostatic chuck. The residual fluorine components, which have been adsorbed on the surface of the electrostatic chuck, cannot be sufficiently reduced and removed even when the radial components are subjected to the treatment using a fluorine-reducing gas. As a result, when forming a semiconductor film after the cleaning process, the residual fluorine components may separate from the surface of the electrostatic chuck (the phenomenon is referred to as "F degasification") and decrease the film-forming (deposition) temperature in the vicinity of the substrate or wafer. This leads to problems including irregular film thickness, defective etching, and film flaking. These drawbacks are serious when forming an FSG film because significant F degasification occurs during the FSG film formation.

SUMMARY OF THE INVENTION

One object of the present invention is to provide a process of cleaning a semiconductor manufacturing system that does have the above described problem(s).

Another object of the present invention is to provide a method of fabricating a semiconductor device that does have the above described problem(s).

According to one aspect of the present invention, there is provided an improved process of cleaning a semiconductor manufacturing system. The semiconductor manufacturing system has a reaction chamber and a substrate-supporting electrode provided inside the reaction chamber. A substrate is located on the substrate-supporting electrode when forming a semiconductor film on the substrate. The cleaning process includes positioning an insulating cover on the substrate-supporting electrode in close or tight contact with the substrate-supporting electrode, supplying a fluoride-based cleaning gas into the reaction chamber, and generating a plasma in the reaction chamber.

According to a second aspect of the present invention, there is provided another improved method of cleaning a semiconductor manufacturing system. The semiconductor manufacturing system has a reaction chamber and a substrate-supporting electrode provided inside the reaction chamber. A substrate is placed on the substrate-supporting electrode when forming a semiconductor film on the substrate. The cleaning process includes positioning an insulating cover on the substrate-supporting electrode, supplying a fluoride-based cleaning gas into the reaction chamber, supplying an inert gas and/or a fluorine-reducing gas into the reaction chamber, and generating a plasma in the reaction chamber. The inert gas and/or the fluorine-reducing gas is supplied from an approximate center of the substrate-supporting electrode through a gap between the insulating cover and the substrate-supporting electrode. A pressure in the gap is maintained to be higher than a pressure in the reaction chamber.

According to a third aspect of the present invention, there is provided another process of cleaning a semiconductor manufacturing system. The semiconductor system has a reaction chamber and a substrate-supporting electrode provided inside the reaction chamber. A substrate is placed on the substrate-supporting electrode when forming a semiconductor film on the substrate. The cleaning process includes positioning an insulating cover on the substrate-supporting electrode, supplying a fluoride-based cleaning gas into the reaction chamber and then generating a plasma in the reaction chamber. The process also includes removing the insulating cover from the substrate-supporting electrode to expose a surface of the substrate-supporting electrode, supplying a fluorine-reducing gas into the reaction chamber, and generating a plasma.

According to a fourth aspect of the present invention, there is provided another process of cleaning a semiconductor manufacturing system. The semiconductor system has a reaction chamber and a substrate-supporting electrode provided inside the reaction chamber. A substrate is placed on the substrate-supporting electrode when forming a semiconductor film on the substrate. The cleaning process includes positioning an insulating cover on the substrate-supporting electrode, supplying a fluoride-based cleaning gas into the reaction chamber, generating a plasma in the reaction chamber, supplying a fluorine-reducing gas into the reaction chamber, generating a plasma, removing the insulating cover from the substrate-supporting electrode to expose a surface of the substrate-supporting electrode, and forming a silicon oxide film containing an excessive amount of silicon therein on the surface of the substrate-supporting electrode.

According to a fifth aspect of the present invention, there is provided another process of cleaning a semiconductor manufacturing system having a reaction chamber and a substrate-supporting electrode provided inside the reaction chamber. A substrate is placed on the substrate-supporting electrode when forming a semiconductor film on the substrate. The cleaning process includes supplying hydrogen gas and an inert gas into the reaction chamber and generating a plasma when the semiconductor manufacturing system is in a standby condition before loading the substrate into the reaction chamber.

According to a sixth aspect of the present invention, there is provided a method of manufacturing a semiconductor device. The manufacturing method includes carrying out any one of the above described cleaning processes, setting the substrate on the substrate-supporting electrode in the reaction chamber, supplying a raw material gas into the reaction chamber, and generating a plasma to form a semiconductor film on the substrate.

Each of the above described processes for cleaning the semiconductor manufacturing system can prevent F degasification from the substrate-supporting electrode (e.g., an electrostatic chuck) during the semiconductor film formation process (deposition process). Thus, it is possible to form the semiconductor film without decreasing the film-forming temperature in the vicinity of the substrate or wafer and avoid troubles including irregular film thickness, defective etching, and film flaking.

DETAILED DESCRIPTION OF THE INVENTION

Figure 1:
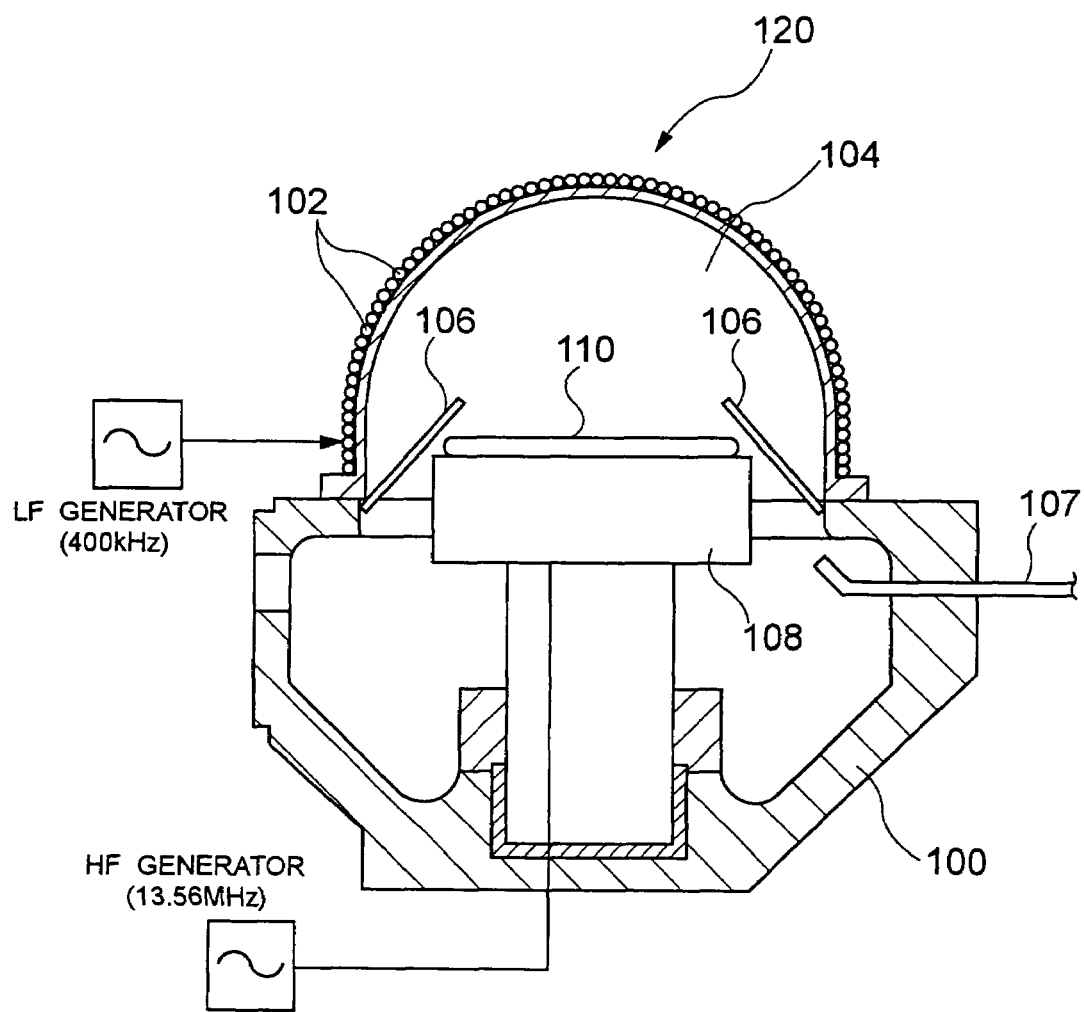
FIG. 1 illustrates a schematic diagram of a semiconductor manufacturing system in connection with a first embodiment of the present invention.

Embodiments of the present invention will be described with reference to the accompanying drawings. It should be noted that similar reference numerals and symbols are used to designate similar elements in different drawings and embodiments, and redundant description for the similar elements may be omitted.

First Embodiment

Referring to FIG. 1, a semiconductor manufacturing system 120 is illustrated.

The semiconductor manufacturing system 120 is a plasma enhanced CVD system. The plasma enhanced CVD system 120 includes a main body 100, a belljar (ceramic dome) 102, and a chamber (reaction chamber) 104. The belljar 102 is an upper electrode. The chamber 104 is sealed with the main body 100 and belljar 102. The semiconductor manufacturing system 120 also includes injectors 106 and an electrostatic chuck (substrate-supporting electrode) 108, both are positioned inside the chamber 104. The electrostatic chuck 108 is a lower electrode. The main body 100 has an outlet (not shown), and the chamber 104 is evacuated through the main body outlet. A raw material gas is supplied into the vacuum chamber 104 from the injectors 106, a plasma is generated at a frequency of, for example, 400 kHz from the belljar 102 and a plasma is generated at a frequency of, for example, 13.56 kHz from the electrostatic chuck 108, to perform a deposition process. The semiconductor manufacturing system 120 also includes another injector 107 for supplying a fluoride-based cleaning gas into the chamber 104.

A process of cleaning the semiconductor manufacturing system 120 will be described. Firstly, a ceramic cover (insulating cover) 110 is placed on the electrostatic chuck 108 in the chamber 104 to protect the surface of the electrostatic chuck 108. Secondly, a voltage of, for example, about 600 volts is applied to the electrostatic chuck 108 to firmly secure the ceramic cover 110 with the surface of the electrostatic chuck 108. It should be noted that the firm contact between the ceramic cover 110 and the electrostatic chuck 108 may be established by a mechanical element (e.g., a clamp ring; not shown), instead of applying the voltage of about 600 volts to the electrostatic chuck 108.

Thereafter, the pressure in the chamber 104 is maintained, for example, at about 0.1333-1.333 Pa (1-10 mTorr) while supplying $NF_3$ gas (i.e., a fluoride-based cleaning gas) from the injector 107, for example, at 100-1000 sccm.

Further, a plasma, for example, having a frequency of 13.56 MHz is generated from the belljar 102 at an output power of 1000-1500 W to excite the $NF_3$ gas into plasma and create F radicals. The radicals react with deposits such as a silicon oxide film deposited on the inner wall of the chamber 104 to create volatile compounds such as $SiF_4$. The volatile compounds are discharged from the chamber 104 and therefore the deposits are removed.

Then, the pressure in the chamber 104 is maintained for example at about 0.1333-1.333 Pa (1-10 mTorr) and $H_2$ gas (fluorine-reducing gas) is supplied from the injector into the chamber 104, for example, at 200-1000 sccm.

A plasma, for example, having a frequency of 13.56 MHz is generated from the belljar 102 at an output power of 500-1500 W to excite the $H_2$ gas into plasma. The resulting hydrogen radicals react with residual fluorine components deposited on the inner wall of the chamber 104 to reduce and remove the residual fluorine components.

The process of cleaning the CVD system 120 is thus completed. Thereafter, precoating is performed, and the cover 110 is removed. Then, a wafer is loaded into the chamber 104 and set on the electrostatic chuck 108 to start a process of forming semiconductor films such as FSG films (deposition process).

In this embodiment, the ceramic cover 110 is positioned on the electrostatic chuck 108 such that the ceramic cover 110 has a close or tight contact with the electrostatic chuck 108. In other words, the ceramic cover 110 is located on the electrostatic chuck 108 with no clearance between the ceramic cover 110 and the surface of the electrostatic chuck 108. This prevents $NF_3$ from entering between the ceramic cover 110 and the surface of the electrostatic chuck 108 when $NF_3$ is supplied into the chamber 104. Therefore, it is possible to prohibit the adsorption of fluorine components on (in) the surface of the electrostatic chuck 108, and thus prevent occurrence of F degasification from the electrostatic chuck 108 during the semiconductor film formation process (deposition process).

Second Embodiment

Figure 2:
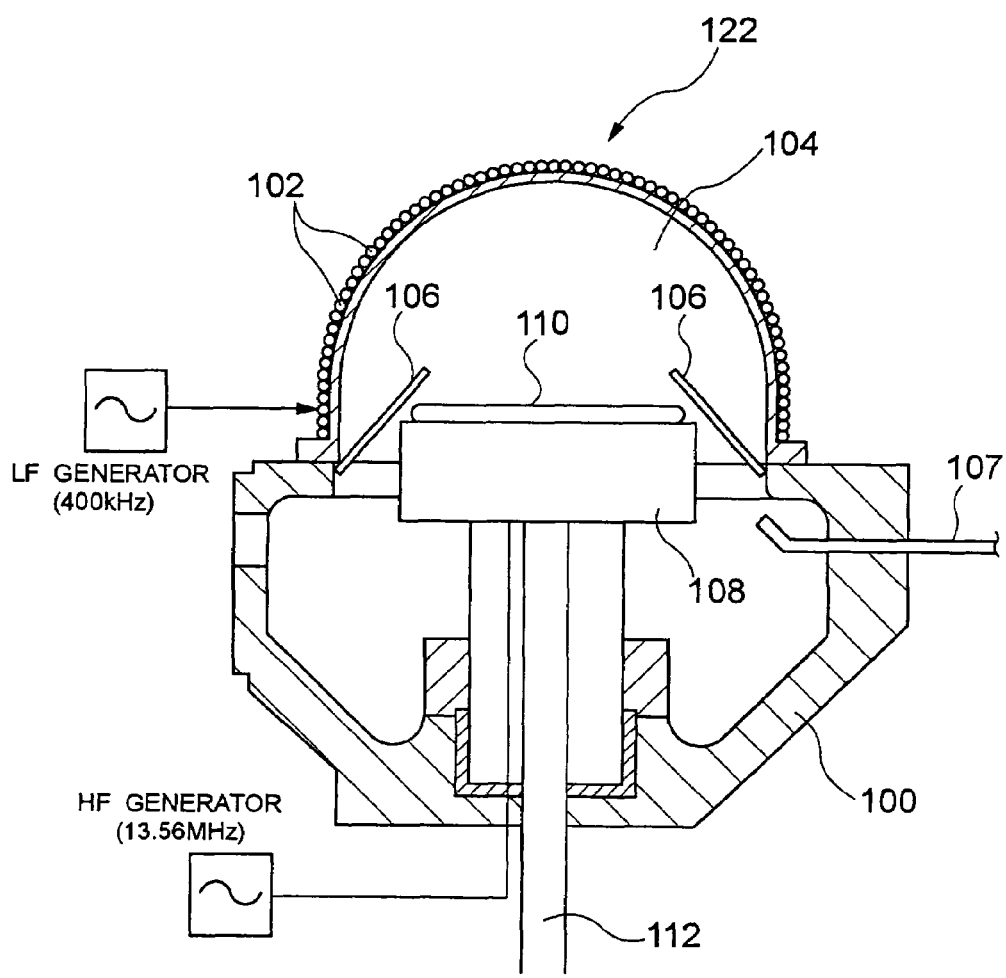
FIG. 2 illustrates a schematic diagram of a semiconductor manufacturing system in connection with a second embodiment of the present invention.

FIG. 2 is a schematic diagram showing a semiconductor manufacturing system 122 in connection with the second embodiment of the invention.

The semiconductor manufacturing system 122 has a similar structure to the semiconductor manufacturing system 120 shown in FIG. 1, but the system 122 has a supply pipe 112 extending downwardly from the center (or the approximate center) of the electrostatic chuck 108.

A process of cleaning the semiconductor manufacturing system 122 will be described. In this embodiment, firstly, the ceramic cover 110 is placed on the electrostatic chuck 108 in the chamber 104 to protect the surface of the electrostatic chuck 108.

Secondly, the pressure in the chamber 104 is maintained for example at about 0.1333-1.333 Pa (1-10 mTorr) while supplying $NF_3$ gas into the chamber 104 from the injector 107 for example at 100-1000 sccm and helium (He) gas toward the center (or approximate center) of the ceramic cover 110 from the supply pipe 112 for example at 60-120 sccm. The $NF_3$ gas is one example of a fluoride-based cleaning gas, and the He gas is one example of an inert gas. The He gas supplied from the supply pipe 112 first reaches the center (or approximate center) of the electrostatic chuck 108, and flows in the clearance between the ceramic cover and the electrostatic chuck 108. The He gas then flows radially outwards towards the periphery of the ceramic cover 110, and enters the chamber 104. The He gas is supplied into the chamber such that the pressure in the gap between the ceramic cover and the electrostatic chuck 108 is higher than the pressure in the chamber 104.

Then, a plasma, for example, having a frequency of 13.56 MHz is generated with the belljar 102 or the upper electrode at an output power of 1000-5000 W to excite the $NF_3$ gas into plasma and create F radicals. The radicals react with deposits such as a silicon oxide film deposited on the inner wall of the chamber 104 to create volatile compounds such as $SiF_4$. The volatile compounds are discharged from the chamber 104 and therefore the unnecessary deposits are removed.

Next, the pressure in the chamber 104 is maintained for example at about 0.1333-1.333 Pa (1-10 mTorr) while supplying $H_2$ gas for example at 200-1000 sccm into the chamber 104. The $H_2$ gas is an example of the fluorine-reducing gas.

A plasma, for example, having a frequency of 13.56 MHz is generated with the belljar 102 at an output power of 500-1500 W to excite the $H_2$ gas into plasma. The resultant hydrogen radicals react with residual fluorine components adsorbed on the inner wall of the chamber 104 to reduce and remove the residual fluorine components.

The process of cleaning the CVD system 122 is thus completed. Thereafter, precoating is performed, and the cover 110 is removed. Then, a wafer is loaded into the chamber 104 and set on the electrostatic chuck 108 to start a process of forming a semiconductor film such as FSG film.

In this embodiment, the $NF_3$ gas is supplied into the chamber 104 and the He gas is also supplied into the chamber 104. The He gas flows through the clearance between the ceramic cover 110 and the electrostatic chuck 108, and the pressure in the clearance between the ceramic cover 110 and the electrostatic chuck 108 is maintained to be higher than the pressure in the chamber 104. Further, the He gas flows radially outwards in the cover-chuck clearance from the center of the electrostatic chuck 108. Consequently, the $NF_3$ gas in the chamber 104 does not flow into the higher-pressure clearance between the ceramic cover 110 and the electrostatic chuck 108. Therefore, it is possible to prevent fluorine components from being adsorbed on the surface of the electrostatic chuck 108 and to avoid F degasification from the electrostatic chuck 108 during a process of forming a semiconductor film.

According to the second embodiment, it is possible to prevent the $NF_3$ gas from flowing into the cover-chuck clearance even if there is a clearance between the electrostatic chuck 108 and the cover 110. Therefore, it is possible to prohibit the adsorption of fluorine components on (in) the surface of the electrostatic chuck 108.

Third Embodiment

The third embodiment is a modification to the second embodiment. He gas is supplied into the chamber 104 from the supply pipe 112 in the second embodiment, but He gas diluted with $H_2$ gas (He/$H_2$ gas) is supplied into the chamber 104 from the supply pipe 112 in the third embodiment.

The third embodiment makes it possible to prevent $NF_3$ gas, which is supplied into the chamber 104 from the injector 107, from flowing into the clearance between the ceramic cover 110 and the electrostatic chuck 108, as in the second embodiment. The He/$H_2$ gas flows into the chamber 104 from the periphery of the ceramic cover 110 (the ceramic cover periphery is the end of the clearance between the ceramic cover 110 and the electrostatic chuck 108) so that $H_2$ is excited into plasma in the vicinity of the ceramic cover periphery. This makes it possible to reduce and remove the fluorine components in the periphery of the electrostatic chuck 108. Therefore, the adsorption of fluorine components on the surface of the electrostatic chuck 108 can be prevented more effectively.

Fourth Embodiment

The fourth embodiment is a modification to the first embodiment. In the fourth embodiment, a process of cleaning the semiconductor manufacturing system 120 (FIG. 1) is carried out as follows. Firstly, the ceramic cover 110 is put on the electrostatic chuck 108 in the chamber 104 to protect the surface of the electrostatic chuck 108.

Secondly, the pressure in the chamber 104 is maintained, for example, at about 0.1333-1.333 Pa (1-10 mTorr) while supplying $NF_3$ gas (fluoride-based cleaning gas) through the injector 107, for example, at 100-1000 sccm.

Thirdly, a plasma, for example, having a frequency of 13.56 MHz is generated with the belljar 102 at an output power of 1000-5000 W to excite the $NF_3$ gas into plasma and create F radicals. The radicals react with deposits such as a silicon oxide film deposited on the inner wall of the chamber 104 to create volatile compounds such as $SiF_4$. The volatile compounds are exhausted from the chamber 104 and therefore the unnecessary deposits are removed.

Then, the ceramic cover 110 is removed from the electrostatic chuck 108 and taken out from the chamber 104 by a vacuum transportation unit (not shown) to expose the surface of the electrostatic chuck 108.

When the surface of the electrostatic chuck 108 is exposed, the pressure in the chamber 104 is maintained for example at about 0.1333-1.333 Pa (1-10 mTorr) and $H_2$ gas (fluorine-reducing gas) is supplied into the chamber 104 for example at 200-1000 sccm.

A plasma, for example, having a frequency of 13.56 MHz is generated with the belljar 102 at an output power of 500-1500 W to excite the $H_2$ gas into plasma. The resultant hydrogen radicals react with residual fluorine components adsorbed on the inner wall of the chamber 104 to reduce and remove the residual fluorine components.

The process of cleaning the CVD system 120 is thus complete. Thereafter, a wafer is loaded into the chamber 104 and placed on the electrostatic chuck 108 to start a process of forming a semiconductor film such as an FSG film.

In this embodiment, after the cleaning is carried out using the $NF_3$ gas, the fluorine-reducing treatment is performed with the ceramic cover 110 being dismounted from the electrostatic chuck 108 and the surface of the electrostatic chuck 108 being exposed. This reduces and removes residual fluorine components adsorbed on the surface of the electrostatic chuck 108 because the fluorine-reducing treatment is performed when the surface of the electrostatic chuck 108 is exposed. It should be recalled that conventionally the fluorine-reducing treatment is carried out to reduce and remove residual fluorine components deposited on the inner wall of the chamber 104 and the wall of belljar 102. Therefore, it becomes possible to avoid F degasification from the electrostatic chuck 108 during a subsequent process of forming a semiconductor film.

Fifth Embodiment

The fifth embodiment is a modification to the first embodiment. In the fifth embodiment, cleaning by use of the $NF_3$ gas and the fluorine-reducing treatment using the $H_2$ gas are carried out as in the first embodiment, but the ceramic cover 110 is not in close or tight contact with the electrostatic chuck 108.

After the fluorine-reducing treatment using the $H_2$ gas, the ceramic cover 110 is detached from the electrostatic chuck 108 and taken out of the chamber 104 by a vacuum transportation unit (not shown) to expose the surface of the electrostatic chuck 108.

When the surface of the electrostatic chuck 108 is exposed, the pressure in the chamber 104 is maintained for example at about 0.1333-1.333 Pa (1-10 mTorr) while supplying $SiH_4$ gas, $O_2$ gas, and argon (Ar) gas into the chamber 104 from the injectors 106. The $SiH_4$ gas, $O_2$ gas, and Ar gas are reactive gases. The flow rates of the reactive gases are, for example, as follows: $SiH_4$ gas=180 sccm, $O_2$ gas=340 sccm, and Ar gas=240 sccm, and the ratio $SiH_4$ gas/$O_2$ gas is equal to or greater than 1.5 so that a silicon oxide film to be formed contains an excessive amount of silicon.

Then, a plasma, for example, having a frequency of 450 kHz is generated with the belljar 102 at an output power of 3000-4000 W to excite the reactive gases into plasma, thereby forming a silicon oxide film containing an excessive amount of silicon to a thickness of about 30-100 nm on the surface of the electrostatic chuck 108.

The cleaning process of the CVD system 120 is thus completed. Thereafter, a wafer is loaded into the chamber 104 and set on the electrostatic chuck 108 to start a process of forming a semiconductor film such as FSG film. It should be noted that the silicon oxide film formed on the surface of the electrostatic chuck 108 is removed in the $NF_3$ gas cleaning process after a semiconductor film forming process is repeated for a certain number of times.

In this embodiment, a silicon oxide film containing excess silicon is formed on the electrostatic chuck 108. This prevents the F degasification in a subsequent process of forming a semiconductor film because fluorine atoms resulting from the residual fluorine components adsorbed on the surface of the electrostatic chuck are trapped by dangling bonds of silicon contained in the silicon oxide film formed on the surface of the electrostatic chuck.

Sixth Embodiment

The sixth embodiment is a modification to the first embodiment. In the sixth embodiment, a process of cleaning the semiconductor manufacturing system 120 (FIG. 1) is carried out as follows. Firstly, no cover is placed on the electrostatic chuck 108, i.e., the surface of the electrostatic chuck 108 is exposed. Secondly, when the system 120 operates in an idling condition (or stand-by condition), the pressure in the chamber is maintained for example at about 0.1333-1.333 Pa (1-10 mTorr) and $H_2$ gas diluted with Ar gas (Ar/$H_2$ gas) is supplied into the chamber 104 from the injectors 106 for example at 100-1000 sccm. The substrate is not put into the chamber 104 in the idling/stand-by condition of the system 120. It should be noted that the Ar gas is one example of the inert gas, and it may be replaced with any other suitable gas such as He gas.

Thirdly, a plasma, for example, having a frequency of 450 kHz is generated with the belljar 102 at an output power of 1000-5000 W to excite the $H_2$ gas into plasma. The resultant hydrogen radicals react with residual fluorine components adsorbed on the inner wall of the chamber 104 and the exposed surface of the electrostatic chuck 108 to reduce and remove the residual fluorine components.

Thereafter, a wafer is loaded into the chamber 104 and set on the electrostatic chuck 108 to carry out a process of forming a semiconductor film such as FSG film.

Here, a conventional approach should be described. In the conventional approach, $O_2$ gas diluted with Ar gas (Ar/$O_2$ gas) is constantly supplied into the chamber 104 from the injectors 106 to generate a plasma with the belljar 102 in order to keep a temperature in the chamber 104 when the semiconductor manufacturing system is operating in the idling condition. During the idling condition, none of a semiconductor film formation process, a cleaning process with a fluoride-based cleaning gas, and a fluorine-reducing treatment is performed. A mixture of $H_2$ gas and $O_2$ gas ($H_2$/$O_2$ gas) is sometimes used instead of Ar/$O_2$ gas in anticipation of the fluorine-reducing effect (see Japanese Patent Kokai No. 9-249976, for example). However, when $H_2/O_2$ gas is used, the plasma excitation may produce $H_2O$ in the chamber 104, and the residual $H_2O$ may be trapped in a film during a film formation process (deposition process). Therefore, in the sixth embodiment of the present invention, a mixture of Ar gas and $H_2$ gas is supplied into the chamber 104 to generate a plasma during the idling operation of the system 120. Like the $O_2$ gas, the Ar gas can provide a stable plasma. Therefore, it is possible to reduce and remove fluorine components adsorbed on the inner wall of the chamber 104 and the exposed surface of the electrostatic chuck 108 without producing $H_2O$. Accordingly, it is feasible to prevent F degasification from the electrostatic chuck 108 during a subsequent process of forming the semiconductor film.

Seventh Embodiment

The seventh embodiment is a modification to the fifth embodiment. The seventh embodiment provides for an additional cleaning process to be performed after the cleaning process of the fifth embodiment.

When the cleaning process of the fifth embodiment is complete, then a plasma, for example, having a frequency of 13.56 MHz is generated with the electrostatic chuck 108 at an output power of 100-200 W immediately before a substrate is loaded into the chamber 104 (30-60 seconds in advance of the wafer loading, for example).

Since the plasma is generated from the electrostatic chuck 108 immediately before loading the substrate into the chamber 104, $H^+$ and $Ar^+$ created in the preceding treatment due to decomposition collide upon the electrostatic chuck 108. The collision energy causes fluorine adsorbed on the surface of the electrostatic chuck 108 to separate from the electrostatic chuck 108, whereby the residual fluorine components can be removed more efficiently. Thus, it is possible to prevent F degasification from the electrostatic chuck 108 during the subsequent process of forming the semiconductor film. The wafer or substrate is placed on the electrostatic chuck 108 in the process of forming a semiconductor film.

In this embodiment, because the output power of a plasma generated with the electrostatic chuck 108 immediately before loading the substrate into the chamber 104 has a very small value (about 100-200 W), the surface of the electrostatic chuck 108 is not damaged when the fluorine is separated from the electrostatic chuck 108.

The present invention is not limited to the above described embodiments. For instance, although the $NF_3$ gas is used as a fluoride-based cleaning gas in the first to fifth embodiments, $CF_4$, $C_3F_8$, $C_2F_6$, and $ClF_3$ may be used instead of $NF_3$. Further, although the $H_2$ gas is used as a fluorine-reducing gas in the embodiments, a gas containing hydrogen such as $NH_3$ gas may be used instead of the $H_2$ gas.

It should be noted that any of the embodiments do not have a limiting meaning with respect to the scope of the present invention, and various changes and modifications may be made without departing from the scope of the present invention.

What is claimed is:

1. A process of cleaning a semiconductor manufacturing system having a reaction chamber and a substrate-supporting electrode provided inside the reaction chamber, with a substrate being placed on the substrate-supporting electrode when forming a semiconductor film on the substrate, the process comprising:

positioning an insulating cover on the substrate-supporting electrode;

supplying a fluoride-based cleaning gas into the reaction chamber, and supplying at least one of an inert gas and a fluorine-reducing gas into the reaction chamber from an approximate center of the substrate-supporting electrode through a gap between the insulating cover and the substrate-supporting electrode, a pressure in the gap being maintained to be higher than a pressure in the reaction chamber; and generating a plasma in the reaction chamber.

2. The process of cleaning as set forth in claim 1, wherein the fluoride-based cleaning gas is one of $NF_3$, $CF_4$, $C_3F_8$, $C_2F_6$, and $ClF_3$.

3. The process of cleaning as set forth in claim 1, wherein the fluorine-reducing gas is $H_2$ or $NH_3$.

4. The process of cleaning as set forth in claim 1, wherein the inert gas is He gas.

* * * * *